United States Patent [19]

Pothier

[11] Patent Number: 4,743,887

[45] Date of Patent: May 10, 1988

[54] FAULT LOCATING SYSTEM AND METHOD

[75] Inventor: Robert G. Pothier, Amherst, N.H.

[73] Assignee: Sanders Associates, Inc., Nashua, N.H.

[21] Appl. No.: 549,100

[22] Filed: Nov. 7, 1983

[51] Int. Cl.$^4$ .................... G08B 1/00; G01R 27/04; H01Q 1/32

[52] U.S. Cl. .................... 340/531; 340/514; 342/165; 343/703; 343/714; 343/760; 343/853; 343/894; 343/905; 379/1; 379/2; 379/26; 324/510; 324/58 B; 324/58.5 B

[58] Field of Search ............ 340/531, 533, 539, 514, 340/538, 518, 517, 525, 561, 550–554, 564, 605; 343/703, 714, 760, 905, 906, 894, 853; 455/67, 115; 324/52, 51, 57, 58 B, 58.5 B; 179/175, 175.3 R, 175.3 A, 175.3 F; 342/1, 5, 165; 379/1–3, 24–26

[56] References Cited

U.S. PATENT DOCUMENTS

| | | |
|---|---|---|
| 2,516,060 | 7/1950 | Levenson . |
| 2,549,385 | 4/1951 | Rapuano . |
| 2,649,570 | 8/1953 | Radcliffe .......................... 324/57 |
| 2,656,533 | 10/1953 | London et al. . |
| 2,724,112 | 11/1955 | Hepperle . |
| 2,760,171 | 8/1956 | King . |
| 2,885,677 | 5/1959 | Zaleski . |
| 2,941,166 | 6/1960 | Meyer . |
| 2,942,257 | 6/1960 | Huntington . |
| 2,980,869 | 4/1961 | Rolfs . |
| 2,985,850 | 5/1961 | Crawford et al. . |
| 2,988,740 | 6/1961 | Albanese . |
| 3,035,229 | 5/1962 | Guderian et al. . |
| 3,078,461 | 2/1963 | Dwyer . |
| 3,124,798 | 3/1964 | Zinke . |
| 3,192,531 | 6/1965 | Cox et al. . |
| 3,225,295 | 12/1965 | Altman et al. ................ 324/95 |
| 3,281,848 | 10/1966 | Ames et al. ................... 343/703 |
| 3,355,663 | 11/1967 | Aronoff ......................... 324/58 |
| 3,403,333 | 9/1968 | Wooten .......................... 324/57 |
| 3,407,404 | 10/1968 | Cook et al. . |
| 3,535,628 | 10/1970 | Altes .............................. 324/58 |
| 3,562,753 | 2/1971 | Tanaka et al. ............ 343/781 CA |
| 3,750,012 | 7/1973 | Fellers et al. ................ 324/58 B |
| 3,753,086 | 8/1973 | Shoemaker, Jr. ............ 324/58 B |
| 3,806,943 | 4/1974 | Holloway ..................... 343/703 |
| 3,904,959 | 9/1975 | Britton, Jr. .................. 324/58 B |
| 4,016,569 | 4/1977 | Buebel, Jr. ................... 343/703 |
| 4,097,796 | 6/1978 | Lunden ......................... 324/58 B |
| 4,101,901 | 7/1978 | Kommrusch .................. 343/853 |
| 4,117,398 | 9/1978 | Hudson, Jr. et al. .......... 324/61 R |
| 4,122,447 | 10/1978 | Kawai et al. .................. 343/853 |
| 4,134,119 | 1/1979 | Sandoz et al. ................. 343/703 |
| 4,198,641 | 4/1980 | Gibson ......................... 343/853 |
| 4,274,048 | 6/1981 | Tricoles et al. .............. 324/58 R |
| 4,327,358 | 4/1982 | Karas ........................... 340/564 |
| 4,450,434 | 5/1984 | Nielsen et al. ................ 340/564 |
| 4,475,079 | 10/1984 | Gale .............................. 324/58 B |

FOREIGN PATENT DOCUMENTS

2547394  4/1977  Fed. Rep. of Germany .... 324/58 B

OTHER PUBLICATIONS

Markus, John, *Electronics and Nucleonics Dictionary*, (McGraw-Hill Book Company, 1966) 3rd ed., pp. 259, 545 and 551.

(Continued on next page.)

*Primary Examiner*—Donnie L. Crosland
*Attorney, Agent, or Firm*—Richard I. Seligman; Stanton D. Weinstein

[57] ABSTRACT

A test system for microwave circuits such as employed in aircraft wherein a plurality of antennas are connected to a single processor whereby the continuity of the antennas and connectors between the antennas and the processor can be determined. A test signal is applied to the various antennae of the aircraft and the return signals therefrom received by a test antenna disposed in conjunction with a low-loss coupler from outside of the aircraft. An automated test circuit provides for inputting an identifier of the antenna and circuit portion being tested, and for determining the fault location within the circuit as a function of the circuit portion under test and the distance to the fault; and for displaying the fault location within the circuit. In one embodiment, the low-loss coupler includes the use of a plurality of test antennas in combination with a divider circuit connected to the test antennas by transmission lines. The divider divides the output test signal between the antennas and combines the received signal portions into a composite return signal. In a second embodiment, the low-loss coupler includes a member having a plurality of microwave reflective surfaces disposed to reflect a substantial portion of the radiation pattern of the output signal from the aircraft antenna onto the test antenna.

49 Claims, 6 Drawing Sheets

OTHER PUBLICATIONS

Kraus, John D., Ph. D., *Antennas*, (McGraw-Hill Book Company, New York 1950), pp. 6 and 7.

"A Microprocessor-Controlled Time-Domain Spectrometer", Parisien et al; IEEE, vol. 28, No. 4, Dec. 1979, pp. 269-272.

Western Electric Engng. "Time Domain Reflectometry for Testing Waveguide and Antenna Systems", E. J. Biron Jr., vol. 16, No. 1, Jan. 1972.

Warters, W. D. "The Effects of Mode Filters on the Transmission Characteristics of Circular Electric Waves in a Circular Waveguide", *The Bell System Technical Journal*, vol. 37, No. 3, May 1958, pp. 657-677.

Rakistraw, D. *Procedure for Handling, Installing and Testing Missile Antenna Couplers* (N.T.I.S. Accession No. AD 829109).

Sanders Associates, Inc., *Electronic Warfare Flight Line Test Set AN/USM-406(V)* Brochure B-78-0211.

Sanders Associates, Inc. *EW Flight-Line Test Set: AN/USM-406C(V) The Latest in the AN/USM-406 ATE Family* Brochure B-82-035R1.

Transco Products, Inc. *Microwave Antennas*, Catalog No. 80, (Multi-Graphics, Inc. 3/81)—pp. 80, 56, 58.

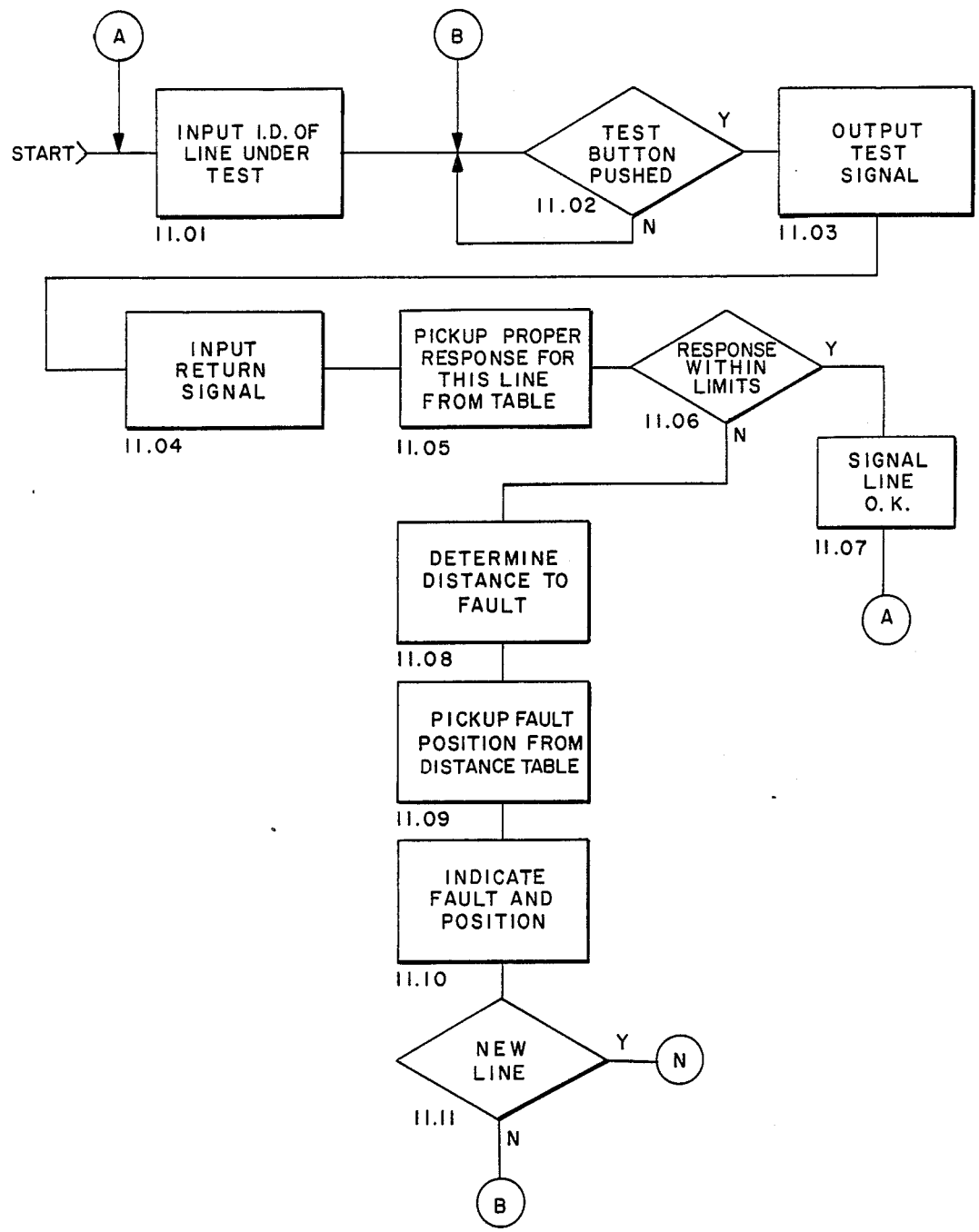
FIG. II

FAULT LOCATING SYSTEM AND METHOD

BACKGROUND OF THE INVENTION

The present invention relates to microwave fault locating systems and, more particularly, to an automated fault locating system employing a low-loss coupler to couple the test signal into and out of an aircraft antenna from outside of the aircraft and for displaying the location of a fault as a function of the portion of the circuit under test and the distance to the fault.

The description hereinafter is with respect to an aircraft test system. Those skilled in the art will recognize that the invention could also be used on ships, missiles, tanks, submarines, and the like. It is intended therefore that the scope of the description and claims which follow include these other applications despite the use of the word "aircraft".

Turning to FIG. 1, a portion of an aircraft 10 is shown containing a microwave system, generally indicated as 12. Microwave system 12 includes antennas 14, a divider 16, and a receiver/transmitter 18. The two antennas 14 are connected to divider 16 by transmission lines 20, having connectors 22 therein. The divider 16 is connected to the receiver/transmitter 18 by another transmission line 20 also containing connectors 22. Other transmission lines 20 to and from the receiver/transmitter 18 are connected to other elements (not shown). The above-described components in the aircraft 10 are contained behind a plurality of access doors in the aircraft's skin (not shown). Typically, problems are created by personnel opening the access doors and manipulating the transmission lines 20 and connectors 22. Connectors 22 are left disconnected or are broken causing improper connections such that the continuity between the antennas 14 and the receiver/transmitter 18 in the various segments of the total circuit of the microwave system 12 is impaired.

One method of testing the microwave system 12 is shown in FIGS. 2 and 3. A test unit 24 connected to a test antenna 26 by line 28 is used to insert a test signal into one of the antennas 14 from whence it travels down the associated transmission line 20, as indicated by the arrow 30, and is received by an antenna, similar to test antenna 26, disposed at an aircraft 10 transmitting antenna (not shown) connected to an opposite end of transmission line 20, whence it is provided to test unit 24. If a discontinuity occurs at one of the connectors 22 as shown in FIG. 3, the signal arriving at such transmitting antenna of aircraft 10 via transmission line 20 is changed. Alternatively, if test unit 24 is a reflectometer, then line 28 can be directly connected to transmission line 20 rather than through test antenna 26 and an antenna 14. In this alternate configuration, test unit 24 connected to transmission line 20 is used to insert a test signal into transmission line 20 which returns to line 28 and test unit 24 as a result signal. If a discontinuity occurs at one of the connectors 22 as shown in FIG. 3, then the return signal is changed and the test unit 24 can determine the distance along the transmission line 20 to the fault. Typically, this is followed by further opening of the access panels to search for the exact location of the fault since the distance to the fault is only an approximate indicator to the technician. Further access through the access panels often gives rise to further inducement of faults into the system 12.

As shown in FIGS. 2 and 3, the test antenna 26 is typically close coupled to the antenna 14. It would be desirable to completely eliminate the necessity for physical access to the system 12 but, unfortunately, with prior art systems, this has been impossible. The reason is shown in FIGS. 4 and 5. According to the prior art, it has been attempted to position the test antenna 26 within an enclosure 36 of an anechoic material to be placed against the fuselage 38 of the aircraft in alignment with the antenna 14 to be tested. The result, typically, is a 20 dB loss between the test antenna 26 and the antenna 14 under test. A 10 dB loss is typical between the antenna 14 and the receiver/transmitter unit under test (UUT) 18. With typical test apparatus available in the art, this two-way loss of 60 dB (20 dB+10 dB+10 dB+20 dB in two directions) is greater than allowable to still obtain meaningful results. This is as a result of the typical antenna pattern as shown in FIG. 5. Antenna 14 typically has a major lobe 14 disposed along its alignment axis 42 with a plurality of minor sidelobes 44. With an arrangement such as that of FIG. 4, a significant portion of the radiated energy to and from the antenna 14 is lost which accounts for the high loss at the interface.

Wherefore, it is the object of the present invention to provide a microwave fault locating system which incorporates a low-loss coupler and which provides direct indication of fault location whereby the necessity for physical access to the system through access panels other than at the known site of a fault to correct the fault is eliminated.

It is a further object to provide a test system for a vehicle microwave system wherein the determination and location of faults is accomplished without previous disassembly or teardown of the vehicle and microwave lines.

SUMMARY

The foregoing objects have been met in a microwave fault locating system including a transducer for inputting a test signal into a microwave conducting circuit disposed between a first antenna and a processor for receiving the return signal therefrom and means for determining the distance to a fault in the circuit from the point of inputting the test signal by the improvement of the present invention comprising second antenna means for transmitting the test signal into the first antenna and for receiving the return signal from the first antenna; and, low-loss coupler means disposed in operative cooperation between the second antenna means and the first antenna for passing the test signal and return signal therebetween with low attenuation; i.e., 10 dB or less.

In the preferred embodiment, the low-loss coupler means comprises a member having a plurality of microwave reflective surfaces disposed to receive and reflect the various radiation lobes of the output signal from the first antenna onto the second antenna means.

In an alternate embodiment, the second antenna means comprises a plurality of antenna members disposed to intercept the various radiation lobes of the first antenna and the low-loss coupler means comprises a divider connected with a plurality of equal length transmission lines to respective ones of the antenna members for receiving the test signal and dividing it between the antenna members and for receiving portions of the return signal received by the antenna members and combining the portions into a single composite return signal for processing.

In both cases, for providing automated fault location indication, the present invention includes means for inputting the identification of the first antenna and circuit portion being tested by an operator; means for determining the fault location within the circuit as a function of the identification and the distance to the fault; and means for displaying the fault location within the circuit.

DESCRIPTION OF THE DRAWINGS

FIG. 11 is a logic flow chart for logic to be employed within the processor of the system of FIG. 9.

DESCRIPTION OF THE PREFERRED AND ALTERNATE EMBODIMENT

Figure 4:
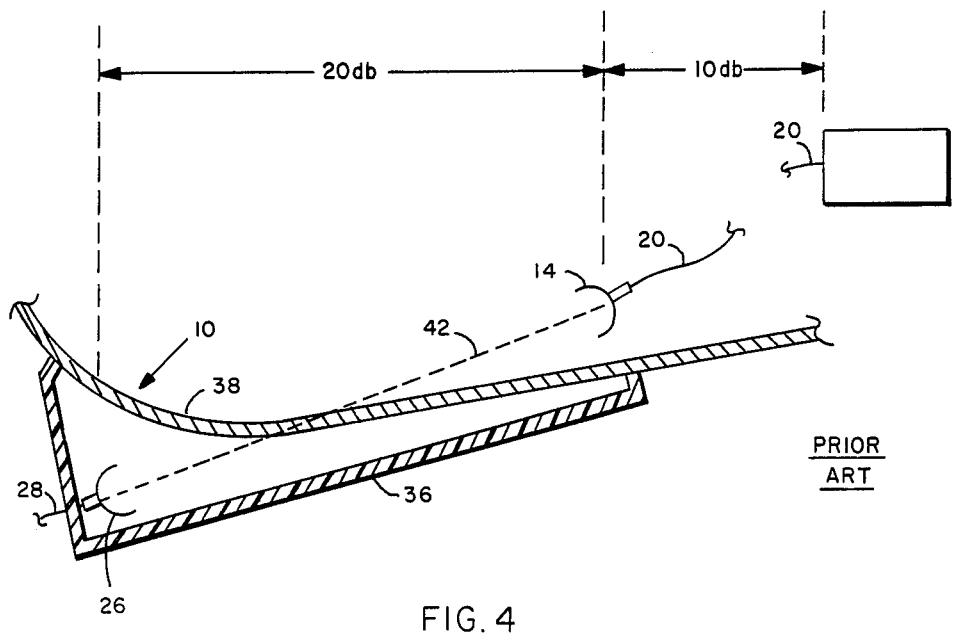
FIG. 4 shows a prior art approach to externally coupling a test apparatus to test a microwave transmission system within an aircraft.
Figure 5:
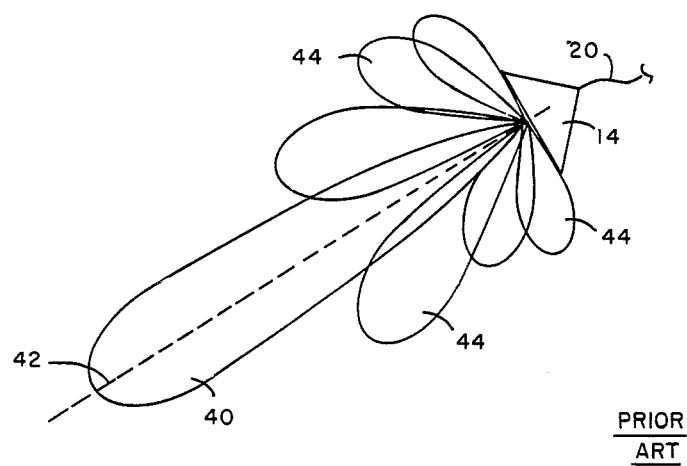
FIG. 5 is a simplified drawing of the various lobes of prior art antennas as wherein the present invention is employed.
Figure 6:
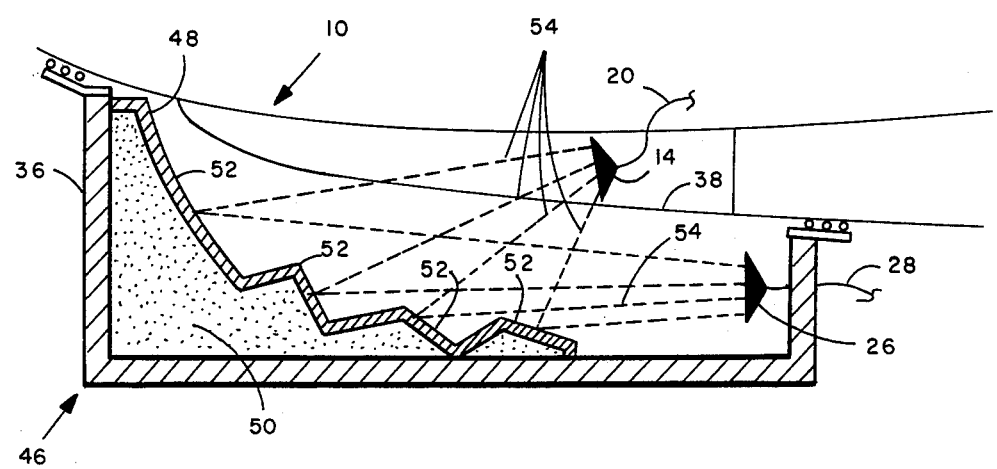
FIG. 6 is a cutaway drawing through a low-loss coupler as employed in the present invention according to the preferred embodiment thereof.

Turning first to FIG. 6, a low-loss coupler according to the present invention in its preferred embodiment is generally indicated as 46. Coupler 46 can provide the low attenuation desired, i.e., 10 dB or less. Coupler 46 comprises an anechoic enclosure 36 substantially identical to that of the prior art apparatus of FIG. 4 and as commonly employed in the art for coupling an antenna on the exterior an aircraft fuselage 38 to an antenna disposed within the fuselage. A test antenna 26 is disposed within the enclosure 36 but, it will be noted, that the test antenna 26 rather than being disposed on the alignment axis 42 of the antenna 14 as in the prior art approach of FIG. 4, is disposed on the opposite end of the enclosure 36. A reflective member 48 is disposed within the enclosure 36 and supported therein as with a foam backing 50. Reflective member 48 contains a plurality of reflective surfaces 52 disposed to receive and reflect the various radiation lobes of the output signal from the antenna 14 onto the test antenna 26 as indicated by the dotted lines 54. In this manner, the reflective surfaces 52 of the reflective member 48 act to the microwave energy passing between the antennas 14, 26 in the manner of a Fresnel lens.

Figure 7:
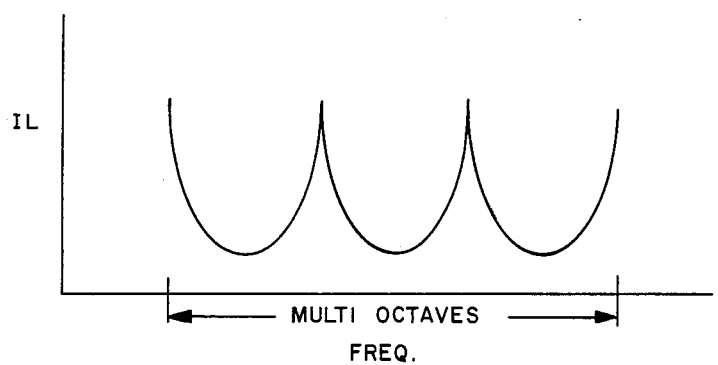
FIG. 7 is a graph of the signal passed by the low-loss coupler of FIG. 6 over a multi-octave frequency range.

A graph of the energy transfer over a typical multi-octave frequency range for the low-loss coupler 46 of FIG. 6 is shown in FIG. 7. As can be seen, there are some "dead" areas and, as a consequence, the whole bandwidth is not transmitted, much less being of a "flat" response. For some applications, the coupler 46 will, therefore, be virtually useless. For continuity testing, as is the primary goal of the present invention, however, the low-loss coupler 46 in its embodiment of FIG. 6 is perfectly suited. Those portions of the passed frequency spectrum having the least attenuation are employed in the continuity testing.

Figure 8:
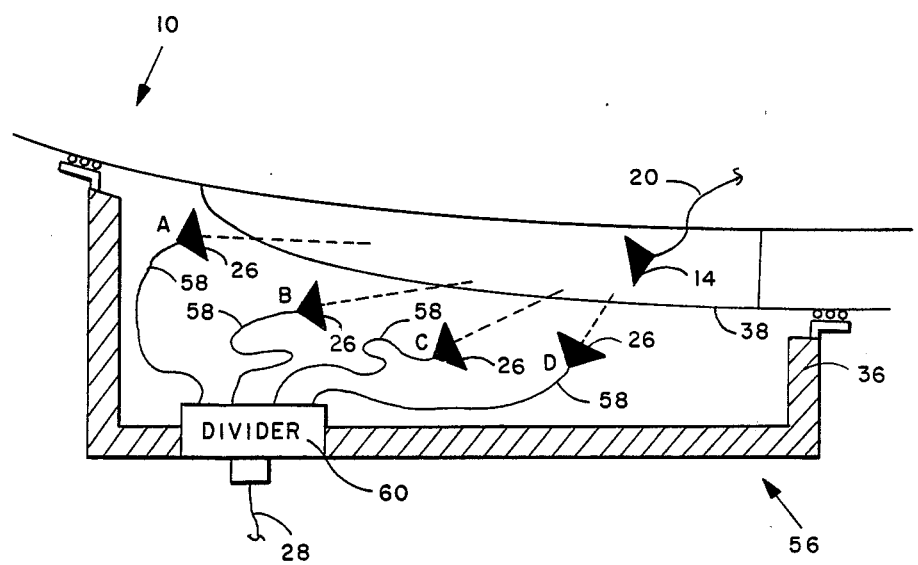
FIG. 8 is a cutaway drawing through a low-loss coupler according to the present invention in an alternate embodiment.

For applications requiring more complete transfer of the entire frequency spectrum, the alternate embodiment low-loss coupler 56 of FIG. 8 is shown. In this embodiment, a plurality of test antennas 26 are employed, labelled "A", "B", "C", and "D", respectively. The test antennas 26 are disposed to intercept the various radiation lobes of the antenna 14 in the manner of the reflective surfaces 52 of the reflective member 48 of FIG. 6. Each of the antennas 26 in the low-loss coupler 56 is connected with a transmission line 58 to a divider 60. Each of the transmission paths 58 is of equal length (including air paths) to avoid shifts in the phase of the various signal portions passing between the antenna 14 and the antennas 26. Thus, signals on the line 28 from the test apparatus to be described in greater detail hereinafter are divided equally between the transmission lines and connected test antennas 26 via the divider 60 while received signals emanating from the antenna 14 as captured by the antennas 26 comprising portions of the entire return signal are combined by divider 60 into a composite return signal which appears on line 28 for use by the test apparatus. It should be noted that while all the frequency spectrum is present employing the low-loss coupler 56 of the embodiment of FIG. 8, a flat response will not be achieved because of the various signal strengths and the distances between the various antennas 26 and the single antenna 14. Appropriate compensation must be provided in each particular case in a manner well known to those skilled in the art.

Figure 9:
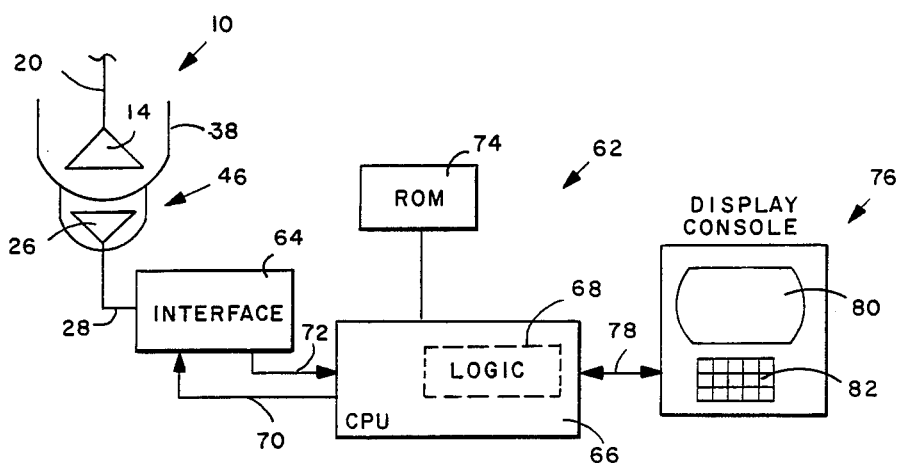
FIG. 9 is a block diagram of a test system according to the present invention.

Turning now to FIG. 9, a test system according to the present invention is shown and generally indicated as 62. The test system 62 comprises the low-loss coupler 46 of FIG. 6 adapted to be operably disposed on the fuselage 38 of the aircraft 10 adjacent one of the antennas 14 which is to be tested along with its associated connecting transmission circuitry to the receiver/transmitter unit under test (UUT) 18. The test antenna 26 contained within the low-loss coupler 46 is connected by its lines 28 to an interface portion 64. Interface portion 64 can be a prior art reflectometer test apparatus. Interface interface portion 64 causes a test signal to be input to antenna 14 from antenna 26 and then receives the return signal from antenna 14 reflecting the condition of the attached transmission line 20 and determines the distance to any fault on the line.

The interface portion 64 is connected to a central processing unit 66 containing logic 68 by lines 70 and 72 over which output commands to the interface portion 64 from the CPU 66 are sent and data from the interface portion 64 to the CPU 66 are returned, respectively. A read-only memory (ROM) 74 is connected to the CPU 66 to be accessed thereby and contains pre-established system data on the microwave system 12 under test in each case. The function of ROM 74 will be discussed in greater detail shortly. Lastly, a display console 76 is connected to the CPU 66 for two-way transmission over connecting lines 78. In the preferred embodiment, the display console 76 contains a CRT display 80 and an operator input keyboard 82 through which data can be input to the system 62.

Figure 10:
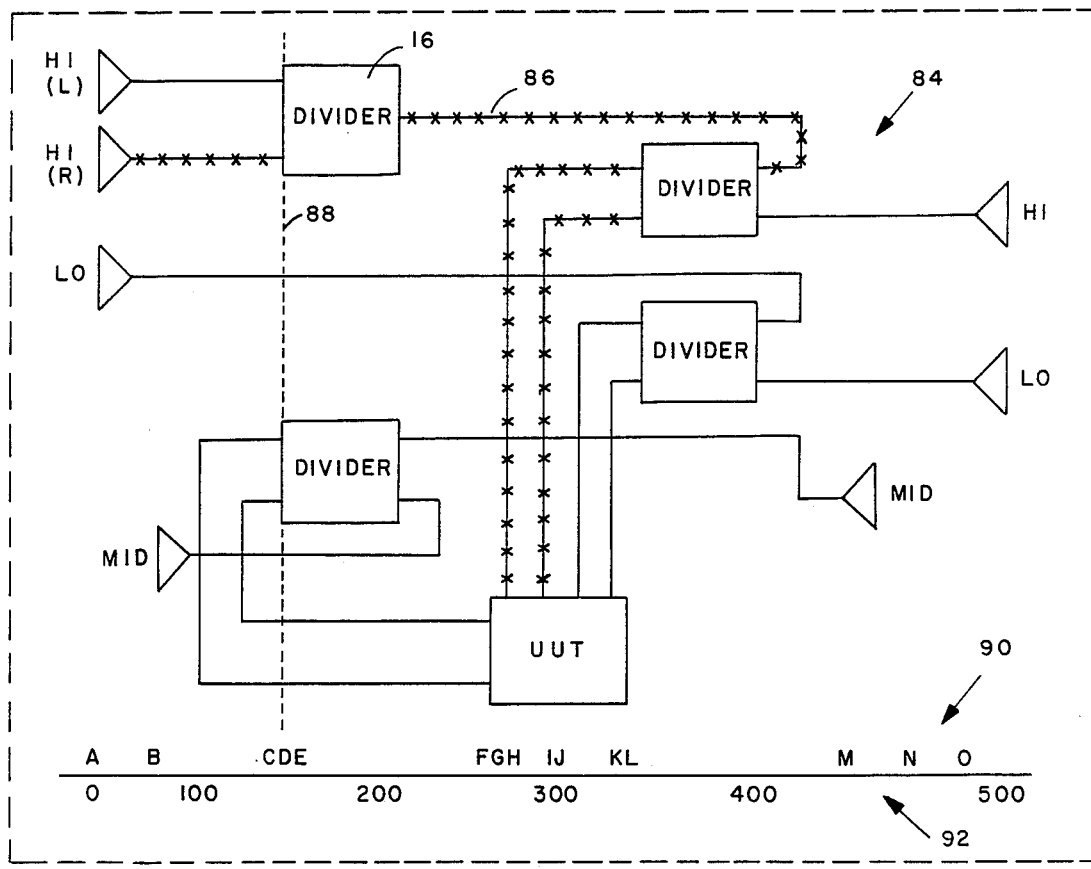
FIG. 10 is a drawing of an exemplary display as output by the system of FIG. 9.

The operation of the test system 62 in its preferred embodiment can best be understood with additional reference to FIGS. 10 and 11. FIG. 10 is a drawing of a typical display output which would appear to a test operator on the CRT 80 of display console 76. FIG. 11 is a basic test logic sequence to be implemented as part of logic 68 to accomplish continuity testing of an aircraft microwave system 12. It will be recalled from FIG. 1 and the discussion relative thereto that a typical aircraft 10 containing a microwave system 12 has various component circuit portions thereof which must be individually tested. The following test sequence, therefore, and the associated pre-established test data must be accomplished for each of the system portions. Consequently, for each aircraft microwave system 12, ROM 74 must contain a profile of proper responses for the various segments comprising each antenna 14, its transmission lines 20, and connectors 22 to the unit under test (UUT) 18.

At test time, the low-loss coupler 46 is attached to the fuselage 38 adjacent one of the antennas 14 and the system 62 activated. When testing is ready to begin, the logic of FIG. 11 is executed, beginning at action block 11.01. At that point, the operator is requested (as by an appropriate message on the CRT 80) to input the identification code for the line under test. The identification code and other input commands required, are input by the operator through the input keyboard 82. Once the line under test has been identified, the logic at decision block 11.02 next checks to see if the active testing should proceed, i.e., has the operator pushed a "test button"? If not, the logic waits until the operator is ready for the teating to proceed. Upon the operator indicating that the test should proceed, at action block 11.03 the logic causes the interface portion 64 to output a test signal through the antenna 26 into the antenna 14 and associated line 20 under test. At section block 11.04, the logic next takes the return signal as provided by the interface portion 64 on line 72. At decision block 11.05, the logic then picks up the proper response for the line under test from the ROM 74. If the received response is within appropriate limits for continuity, as determined at decision block 1.06, the logic at action block 11.07 signals to the operator that the line under test is okay and returns to connector A to continue testing of another line. If the response is not within limits, indicating a fault on the line, at action block 11.08 the logic determines the distance to the fault, at action block 11.09 it picks up the fault position based on the distance and line under test from the ROM 74, and at action block 11.10 indicates to the operator on the CRT 80 of the display console 76 the fact that there is a fault and the position of the fault. At decision block 11.11, the logic finally checks to see if the operator has indicated that a new line is to be tested or not. If it is, the logic proceeds to connector A and if not, (as in the case where the fault is to be corected) the logic proceeds to connector B to await instructions from the operator to continue the testing of the present line under test.

When the logic at action block 11.10 indicates to the operator that a fault has occurred and the position thereof, it is preferred that the display be of a fashion as shown in FIG. 10; that is, ROM 74 also contains display diagrams, such as that generally indicated as 84 in FIG. 10, for the microwave system 12. The portion containing the line under test is displayed as shown in FIG. 10 with the components identified thereon and, in particular, the line under test specifically identified such as by use of a unique color or blinking as indicated by the cross-hatched line 86 in FIG. 10. Having determined the position of the fault with reference to the diagram 84 on the basis of the distance to the fault and the prior knowledge of the system as contained within ROM 74, a cursor 88 is placed on the CRT 80 across the display diagram 84 at the point of the fault. It is also convenient to include within the display diagram 84 identifying poit (i.e., panel number) indicia, generally indicated as 90 and distance (i.e., station) indicia, generally indicated as 92, such that the cursor 88 provides not only a visual indication of the location of the fault, but a general identifying location indicia 90 which can be further investigated from data stored in the ROM 74 which can be called onto the display CRT 80 from the keyboard 82 by the operator or looked up in an associated manual along with an approximate distance as shown by indicia 92. For example, in the line under test as exemplified by the drawing of FIG. 10, it would appear that the connector into the divider 16 at approximately 135 cm in the general location of panel descriptor D is malfunctioning.

Figure 1:
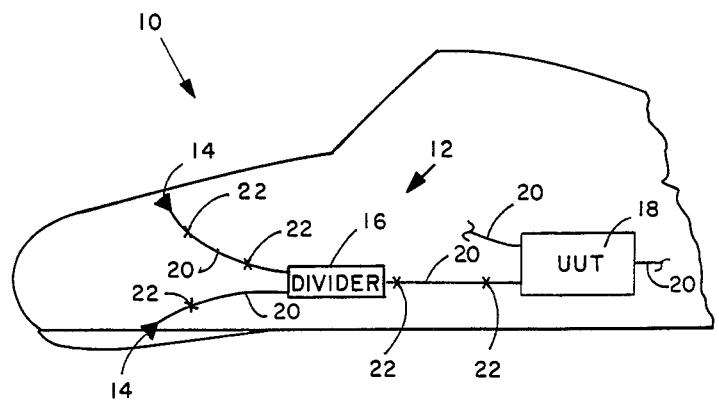
FIG. 1 is a drawing of a portion of a microwave circuit within an aircraft as wherein the present invention is used for testing.
Figure 2:
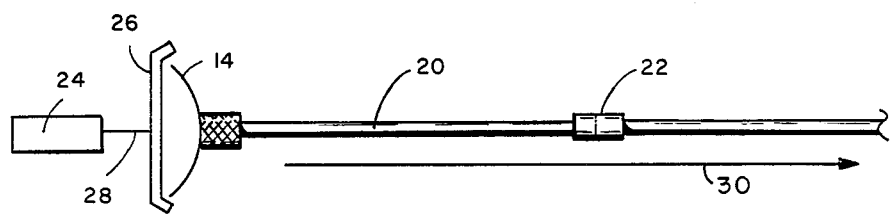
FIG. 2 shows a conventional and known method of testing the continuity of a microwave transmission line.
Figure 3:
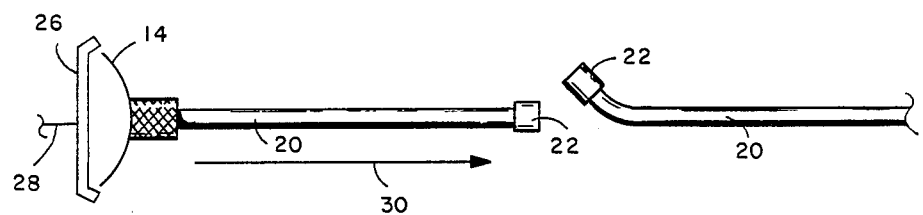
FIG. 3 is a drawing showing the effect of a discontinuity of the test approach of FIG. 2.
Figure 12:
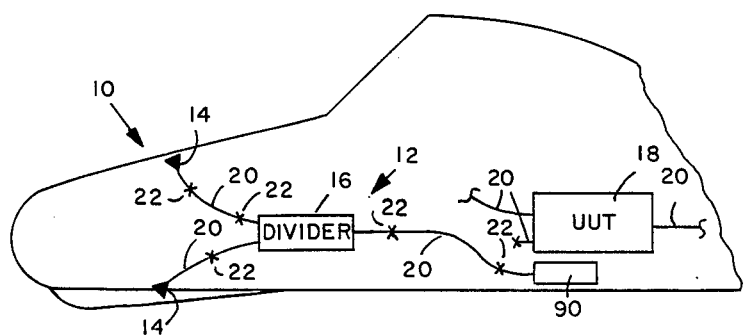
FIG. 12 is a drawing showing how the present invention can be used to measure line attenuation.

The low-loss coupler of the present invention also makes possible a novel method of measuring the aircraft's transmission line attenuation. Referring to FIGS. 1, 9 and 12, the system 62 can be adapted to perform this function as well. The space loss from antenna 14 to antenna 26 is first determined using methods well known to those skilled in the art. The unit under test 18 of FIG. 1 is temporarily replaced by a device 90 having a known reflection coefficient, say a VSWR of infinity (i.e., a short circuit), as shown in FIG. 12. With the low-loss coupler 46 of the present invention positioned adjacent one of the antennas 14 as in FIG. 9, the system 62 can then be used to inject a known test signal into the antenna 14 and measure the attenuation of the associated transmission line from signal loss in the return signal from the antenna 14 usng techniques well known to those skilled in the art. In this manner, all the lines can be tested to within accepable loss limits without aircraft disassembly—except for the temporary reconnection at the UUT 18.

Thus, from the foregoing description, it can be seen that the apparatus of the present invention provide both a low-loss coupler for non-invasive coupling of a signal to the antennas of an aircraft and an associated, automated continuity test system whereby faults within a microwave system of an aircraft can be located and their approximate location indicated to an operator to allow correction to be made thereto with the minimum amount of access through the fuselage of the aircraft and contact with the components of the system.

Wherefore, having thus described my invention, I claim:

1. In a fault locating system for inputting a test signal into a conducting circuit disposed between a first antenna and a processor and for receiving the return signal therefrom and means for determining the distance to a fault in the circuit from the point of inputting the test signal, the improvement comprising:
  (a) second antenna means for transmitting the test signal into the first antenna and for receiving the return signal from the first antenna; and,
  (b) low-loss coupler means disposed in operative connection between said second antenna means and the first antenna for passing the test signal and return signal therebetween with low attenuation.

2. The improvement of claim 1 wherein said low-loss coupler means comprises a member having a plurality of radiation reflective surfaces disposed to receive and reflect a substantial portion of the radiation pattern of the output signal from the first antenna onto said second antenna means.

3. The improvement of claim 1 wherein:
   (a) said second antenna means comprises a plurality of second antennas each disposed to intercept a portion of the radiation pattern of the first antenna; and,
   (b) said low-loss coupler means comprises divider means connected with a plurality of equal length transmission paths, including air paths, to respective ones of said plurality of second antennas for receiving said test signal and dividing it between sid second antennas and for receiving portions of said return signal received by said second antennas and combining said portions into a single, composite return signal for processing.

4. The improvement of claim 1 wherein the circuit being tested comprises a plurality of first antennas and circuit portions connected to the processor and additionally comprising:
   (a) means for inputting an identification of the first antenna and circuit portion being tested;
   (b) means for determining the fault location within said circuit as a function of said identification and distance to the fault; and,
   (c) means for displaying said fault location within said circuit.

5. The improvement of claim 1 wherein said second antennas means is spatically separated from the first antenna.

6. The improvement of claim 3 wherein:
   each second antenna of said plurality of second antennas is substantially differently angularly spaced from the first antenna, with respect to other of said second antennas, to intercept a substantially different portion of the radiation pattern of the first antenna.

7. The improvement of claim 1 wherein:
   a solid surface is operatively disposed between the first antenna and said second antenna means oriented at a nonperpendicular angle with respect to an alignment axis of the first antenna.

8. The improvement of claim 2 wherein:
   said plurality of radiation reflective surfaces comprises a plurality of microwave reflective surfaces.

9. In a fault locating system for inputting a test signal into one of a plurality of conducting circuits disposed between one of a plurlity of first antennas and a processor and for receiving the return signal from the one of the circuits and means for determining the distance to a fault in the circuit from the point of inputting the test signal, the improvement comprising:
   (a) means for inputting an identification of the first antenna and circuit portion being tested;
   (b) means for determining the fault location within said circuit as a function of said identification and the distance to the fault; and,
   (c) means for displaying said fault location within said circuit.

10. The improvement of claim 9 and additionally comprising:
    (a) second antenna means for transmitting the test signal into the first antenna and for receiving the return signal from the first antenna; and,
    (b) low-loss coupler means disposed in operative cooperation between said second antenna means and the first antenna for passing the test signal and return signal therebetween with low attenuation.

11. The improvement of claim 10 wherein:
    said low-loss coupler means comprises a member having a plurality of radiation reflective surfaces disposed to receive and reflect a substantial portion of the radiation pattern of the output signal from the first antenna onto said second antenna means.

12. The improvement of claim 10 wherein:
    (a) said second antenna means comprises a plurality of second antennas each disposed to intercept a portion of the radiation pattern of the first antenna; and,
    (b) said low-loss coupler means comprises divider means connected with a plurality of equal length transmission paths, including air paths, to respective ones of said plurality of second antennas for receiving said test signal and dividing it between said second antennas and for receiving portions of said return signal received by said second antennas and combining said poprtions into a single, composite return signal for processing.

13. The improvement of claim 9 wherein:
    said display means comprises a CRT.

14. The improvement of claim 12 wherein:
    each second antenna of said plurality of second antennas is substantially differently angularly spaced from the first antenna, with respect to other of said second antennas, to intercept a substantially different portion of the radiation pattern of the first antenna.

15. The improvement of claim 9 wherein:
    the test signal includes a frequency in the microwave range; and,
    the conducting circuits comprise microwave conducting circuits.

16. The improvement of claim 10 wherein said second antenna means is spatiallly separated from the first antenna.

17. The improvement of claim 11 wherein:
    said plurality of radiation reflective surfaces comprises a plurality of microwave reflective surfaces.

18. A test system for locating faults in cicuit portions of a conducting circuit having a plurality of first antennas connected to a processor, comprising:
    (a) second antenna means for transmitting a test signal into a selected one of the first antennas and for receiving a return signal from said selected one resulting from said test signal;
    (b) interface means connected to said second antenna means for generating said test signal and applying it to said second antenna means and for receiving said return signal and for generating an output signal reflecting the return signal;
    (c) memory means for storing pre-established valid output signals for each of the circuit portions to be tested;
    (d) input means for an operator to indicate which cirucit portion is being tested; and,
    (e) computing and logic means connected to said interface means, said memory means, and said input means for causing said interface means to output a said test signal, for receiving said output signal from said interface means, for comparing said received output signal to the pre-established valid output signal for the circuit portion under test, for indicating a valid circuit if said received output signal is within pre-established limits of said valid output signal, and for indicating a circuit fault if it is not within said limits.

19. The test system of claim 18 wherein:
the conducting circuit comprises a microwave conducting circuit; and,
said test signal includes a frequency in the microwave range.

20. The improvement of claim 18 wherein said second antenna means is spatially separated from the first antennas.

21. The test system of claim 18 wherein:
(a) said output signal from said interface means includes an indication of the distance to a fault in the circuit portion under test if a fault exists;
(b) said memory means includes a description of the various circuit portions to be tested including distances between components thereof; and,
(c) said computing and logic means is adapted to indicate the location of any fault in the circuit portion under test.

22. The test system of claim 21 and additionally comprising:
(a) visual display means for displaying the configuration of circuit portions under test; and wherein additionally,
(b) said computing and logic means is adapted to display the cicuit portion under test on said display means and to indicate thereon the location of any fault found.

23. The test system of claim 18 and additionally comprising:
low-loss coupler means disposed in operative cooperation between said second antenna means and the first antenna of the circuit under test for passing the test signal and return signal therebetween with low attenuation.

24. The test system of claim 23 wherein:
said low-loss coupler means comprises a member having a plurality of radiation reflective surfaces disposed to receive and reflect a substantial portion of the radiation pattern of the output signal from the first antenna onto said second antenna means.

25. The test system of claim 23 wherein:
(a) said second antenna means comprises a plurality of second antennas each disposed to intercept a portion of the radiation pattern of the first antenna; and,
(b) said low-loss coupler means comprises divider means connected with a plurality of equal length transmission paths, including air paths, to respective ones of said plurality of second antennas for receiving said test signal and dividing it between said second antennas and for receiving portions of said return signal received by said second antennas and combining said portions into a single composite return signal for processing.

26. The test system of claim 24 wherein:
said plurality of radiation reflective surfaces comprises a plurality of microwave reflective surfaces.

27. A low-loss coupler for coupling a signal between a first antenna and a second antenna comprising:
a member having a plurality of radiation reflective surfaces disposed to receive and reflect a substantial portion of the radiation pattern of an output signal from a first antenna onto a second antenna; and
an anechoic housing within which said member is disposed.

28. The low-loss coupler of claim 27 wherein:
each of said surfaces is disposed oriented at a nonperpendicular angle with respect to an alignment axis of the first antenna.

29. The low-loss coupler of claim 27 wherein:
said surfaces are arranged to focus a substantial portion of the radiation pattern of the output signal from the first antenna onto the second antenna substantially in a Fresnel region of the first and second antennas.

30. The low-loss coupler of claim 27 wherein:
said plurality of radiation reflective surfaces comprises a plurality of microwave reflective surfaces.

31. The low-loss coupler of claim 27 wherein:
said member is connected to said anechoic housing.

32. A method of measuring attenuation in a conducting circuit disposed between a first antenna and a processor, comprising the steps of:
(a) providing second antenna means for transmitting a test signal into the first antenna and for receiving a return signal from the first antenna;
(b) positioning the second antenna means in a low-loss coupler disposed to operatively connect the second antenna means and the first antenna to pass the test signal and return signal therebetween with a known space loss and low attenuation;
(c) replacing the processor with a device having a known reflection coefficient;
(d) injecting a known test signal into the first antenna from the second antenna means;
(e) receiving the return signal from the first antenna; and
(f) calculating the signal loss wherein the attenuation of the conducting circuit is determined.

33. The method of claim 32 wherein the conducting circuit comprises a microwave conducting circuit.

34. A low-loss coupler for coupling a signal between a first antenna and a second antenna comprising:
a plurality of radiation reflective surfaces, each said surface disposed adjacent to another said surface, said plurality of surfaces disposed to receive and reflect a substantial portion of various radiation lobes of an output signal from a first antenna onto a second antenna; and
an anechoic housing within which said plurality of radiation reflective surfaces are disposed.

35. The low-loss coupler of claim 34 wherein:
at least one of said surfaces is connected to said anechoic housing.

36. Apparatus for coupling to a first antenna, comprising:
a divider;
a plurality of second antennas, each disposed to intercept a portion of the radiation pattern of the first antenna; and
a like plurality of transmission lines, each line connecting a second antenna to said divider, wherein the length of the transmission path from the first antenna via any second antenna to said divider is substantially equal to the length of any other transmission path from the first antenna via any other second antenna to said divider.

37. Apparatus as recited in claim 36, further comprising:
an anechoic housing within which said plurality of second antennas and said plurality of transmission lines are disposed.

38. Apparatus as recited in claim 36, wherein said second antennas are spatially separated from the first antenna.

39. Apparatus as recited in claim 36 wherein:
each second antenna of said plurality of second antennas is substantially differently angularly spaced from the first antenna, with respect to other of said second antennas, to intercept a substantially different portion of the radiation pattern of the first antenna.

40. A test system for locating faults in a conducting circuit having a plurality of first antennas connected to a processor, comprising:
(a) second antenna means for transmitting a test signal into a selected one of the first antennas and for receiving a return signal from said selected one resulting from said test signal;
(b) interface means connected to said second antenna means for generating said test signal and applying it to said second antenna means and for receiving said return signal and for generating an output signal indicative of the return signal;
(c) memory means for storing pre-established valid output signals for the circuit to be tested; and
(d) computing and logic means connected to said interface means and said memory means for inputting a signal identifying the circuit under test, for causing said interface means to output a said test signal, for receiving said output signal from said interface means, for comparing said received output signal to the pre-established valid output signal for a circuit under test, for indicating a valid circuit if said received output signal is within pre-established limits of said valid output signal, and for indicating a circuit fault if it is not within said limits.

41. A method of measuring attenuation in a conducting circuit connected to a first antenna, comprising the steps of:
(a) operatively connecting, with a known space loss and low attenuation, the first antenna to a second antenna;
(b) operatively connecting the conducting circuit to a device having a known reflection coefficient, before, after or contemporaneous with said previous connecting step;
(c) afer the two preceding operatively connecting steps, transmitting a known test signal from the second antenna into the first antenna;
(d) receiving at the second antenna a return signal, resulting from transmission of the test signal, from the first antenna; and
(e) calculating the signal loss, whereby attenuation of the conducting circuit is determined.

42. The method of claim 41 wherein the conducting circuit comprises a mcirowave conducting circuit.

43. The method of claim 41 wherein the conducting circuit is disposed between the first antenna and a processor, wherein the method further comprises the step of:
before said second conducting step, disconnecting the processor from the conducting circuit.

44. Apparatus for receiving and transmitting one or more signals from or to a first antenna comprising:
a second antenna;
a member having a plurality of radiation reflective surfaces disposed to receive and reflect a substantial portion of the radiation pattern of an output signal from a first antenna onto said second antenna; and
an anechoic housing within which said second antenna and said member are disposed.

45. Apparatus as recited in claim 49 wherein:
said second antenna and said member are each connected to said anechoic housing.

46. Apparatus as recited in claim 44 wherein:
said plurality of radiation reflective surfaces comprises a plurality of microwave reflective surfaces.

47. Apparatus as recited in claim 44 wherein:
each of said surfaces is disposed oriented at a nonperpendicular angle with respect to an alignment axis of the first antenna.

48. Apparatus as recited in claim 44 wherein:
said surfaces are arranged to focus a substantial portion of the radiation pattern of the output signal from the first antenna onto said second antenna substantially in a Fresnel region of the first and second antennas.

49. Apparatus as recited in claim 44 wherein:
said plurality of radiation reflective surfaces comprises a plurality of microwave reflective surfaces.

* * * * *